United States Patent
Adamovich et al.

(10) Patent No.: US 9,142,791 B2
(45) Date of Patent: Sep. 22, 2015

(54) OLED HAVING MULTI-COMPONENT EMISSIVE LAYER

(75) Inventors: Vadim Adamovich, Ewing, NJ (US);
Hitoshi Yamamoto, Ewing, NJ (US);
Michael S. Weaver, Ewing, NJ (US);
Chuanjun Xia, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/113,529

(22) PCT Filed: May 27, 2011

(86) PCT No.: PCT/US2011/038403
§ 371 (c)(1),
(2), (4) Date: Jan. 3, 2014

(87) PCT Pub. No.: WO2012/166101
PCT Pub. Date: Dec. 6, 2012

(65) Prior Publication Data
US 2014/0197389 A1    Jul. 17, 2014

(51) Int. Cl.
*H01L 51/54* (2006.01)
*H01L 51/50* (2006.01)
*H01L 51/56* (2006.01)
*H01L 51/00* (2006.01)

(52) U.S. Cl.
CPC ........ *H01L 51/5056* (2013.01); *H01L 51/5016* (2013.01); *H01L 51/5028* (2013.01); *H01L 51/5072* (2013.01); *H01L 51/56* (2013.01); *H01L 51/0054* (2013.01); *H01L 51/0071* (2013.01); *H01L 51/0074* (2013.01); *H01L 51/0081* (2013.01); *H01L 51/0085* (2013.01); *H01L 2251/308* (2013.01); *H01L 2251/552* (2013.01)

(58) Field of Classification Search
None
See application file for complete search history.

(56) References Cited

U.S. PATENT DOCUMENTS

| | | | | |
|---|---|---|---|---|
| 7,842,341 | B2 * | 11/2010 | Boroson et al. | 427/248.1 |
| 8,294,161 | B2 * | 10/2012 | Hunze et al. | 257/79 |
| 8,723,164 | B2 * | 5/2014 | Schmid et al. | 257/40 |
| 2011/0309307 | A1 * | 12/2011 | Zeika et al. | 252/500 |
| 2012/0037888 | A1 * | 2/2012 | Hunze et al. | 257/40 |

(Continued)

FOREIGN PATENT DOCUMENTS

| | | | | |
|---|---|---|---|---|
| DE | 102008039361 A1 * | 12/2009 | | H01L 51/50 |
| JP | 07-157473 A | 6/1995 | | |

(Continued)

OTHER PUBLICATIONS

Herkstroeter, W.G., and P.B. Merkel. "The Triplet State Energies of Rubrene and Diphenylisobenzofuran." Journal of Photochemistry 16.3 (1981): 331-42.*

(Continued)

*Primary Examiner* — Joseph Schoenholtz
(74) *Attorney, Agent, or Firm* — Duane Morris LLP

(57) ABSTRACT

Organic light-emitting devices having a multi-component organic electroluminescent layer. The organic electroluminescent layer comprises a phosphorescent dopant and a host material that is a mixture of at least three different compounds: a wide band gap host compound, an electron-transporting host compound, and a hole-transporting host compound. Use of such a multi-component organic electroluminescent layer may improve device efficiency and lifetime.

20 Claims, 6 Drawing Sheets

(56) References Cited

U.S. PATENT DOCUMENTS

| | | | | |
|---|---|---|---|---|
| 2012/0045862 | A1* | 2/2012 | Thompson et al. | 438/46 |
| 2012/0205642 | A1* | 8/2012 | Yokoyama et al. | 257/40 |

FOREIGN PATENT DOCUMENTS

| | | | | |
|---|---|---|---|---|
| JP | 2001-110569 | A | 4/2001 | |
| JP | 2002-275179 | A | 9/2002 | |
| JP | 2003-092185 | A | 3/2003 | |
| JP | 2004-217557 | A | 8/2004 | |
| JP | 2004319456 | A | 11/2004 | |
| JP | 2005-340176 | A | 12/2005 | |
| JP | 2006-135147 | A | 5/2006 | |
| JP | 2006128636 | A | 5/2006 | |
| JP | 2006-269819 | A | 10/2006 | |
| JP | 2006-344544 | A | 12/2006 | |
| JP | 2007-277170 | A | 10/2007 | |
| WO | 2009143807 | A1 | 12/2009 | |
| WO | WO 2010075836 | A2 * | 7/2010 | H01L 51/00 |
| WO | 2011013783 | A1 | 2/2011 | |

OTHER PUBLICATIONS

Tokito, Shizuo, Toshiki Iijima, Yoshiyuki Suzuri, Hiroshi Kita, Toshimitsu Tsuzuki, and Fumio Sato. "Confinement of Triplet Energy on Phosphorescent Molecules for Highly-efficient Organic Blue-light-emitting Devices." Applied Physics Letters 83.3 (2003): 569.*

Takizawa, Shin-Ya, Victor A. Montes, and Pavel Anzenbacher. "Phenylbenzimidazole-Based New Bipolar Host Materials for Efficient Phosphorescent Organic Light-Emitting Diodes." Chemistry of Materials 21.12 (2009): 2452-458.*

Lee, Dong-Hyun, Yang-Peng Liu, Kyung-Hee Lee, Heeyeop Chae, and Sung M. Cho. "Effect of Hole Transporting Materials in Phosphorescent White Polymer Light-emitting Diodes." Organic Electronics 11.3 (2010): 427-33.*

Cai, Chao, Shi-Jian Su, Takayuki Chiba, Hisahiro Sasabe, Yong-Jin Pu, Kenichi Nakayama, and Junji Kido. "Efficient Low-Driving-Voltage Blue Phosphorescent Homojunction Organic Light-Emitting Devices." Japanese Journal of Applied Physics 50.4 (2011): 040204.* mCP Data Sheet downloaded from URL <http://www.sigmaaldrich.com/catalog/product/aldrich/701874?lang=en&region=US> on Nov. 4, 2014.*

Schrogel, Pamela. Novel Host Materials for Blue Phosphorescent Organic Light-Emitting Diodes. Thesis. Bayrueth, 2011. Bayreuth: Fach Chemie Der Fakultat Far Biologie, Chemie Und Geowissenschaften, 2011.*

Hou, Liudong, Lian Duan, Juan Qiao, Deqiang Zhang, Liduo Wang, Yong Cao, and Yong Qiu. "Efficient Solution-processed Phosphor-sensitized Single-emitting-layer White Organic Light-emitting Devices: Fabrication, Characteristics, and Transient Analysis of Energy Transfer." Journal of Materials Chemistry 21.14 (2011): 5312.*

Japanese Patent Office, Notice of Reasons for Rejection and English Version of Japanese Office Action regarding corresponding Japanese Application No. JP2014-512812 issued Dec. 15, 2014, pp. 1-10.

Japanese Patent Office, (Examiner-Kawamura, Daisuke), Notice of Reasons for Rejection—English Version of Japanese Office Action regarding corresponding Japanese Application No. JP2014-512812 issued Jun. 23, 2015, pgs. 1-12.

* cited by examiner

FIG. 6
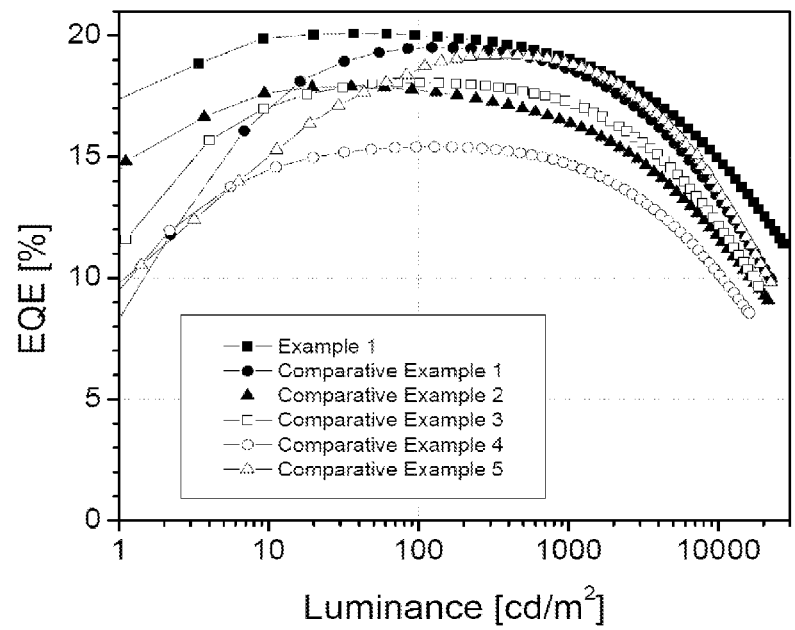
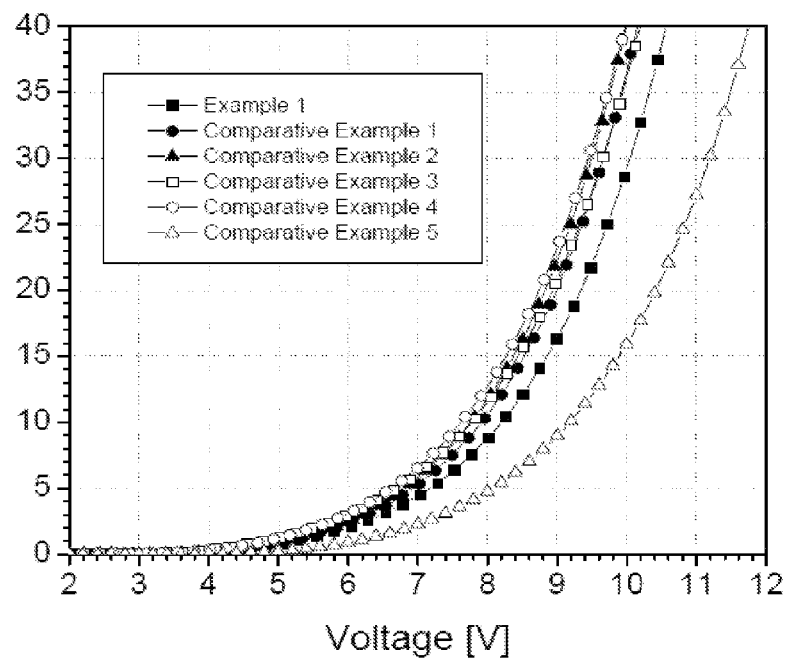
FIG. 7

FIG. 8
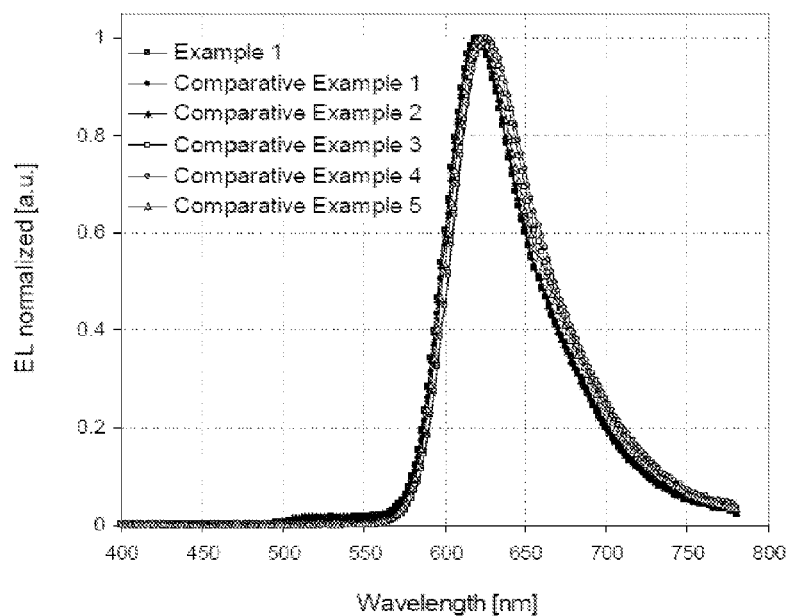
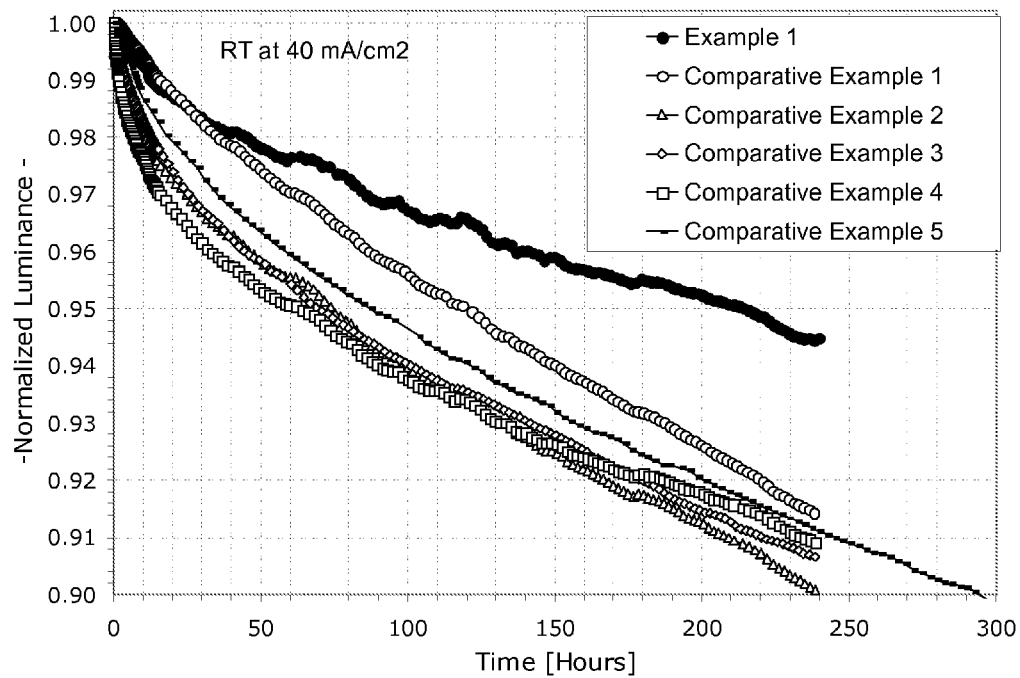
FIG. 9

OLED HAVING MULTI-COMPONENT EMISSIVE LAYER

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

TECHNICAL FIELD

The present invention relates to organic light-emitting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photo detectors.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the structure below (in this, and later figures herein, the dative bonds to the metal are depicted as straight lines):

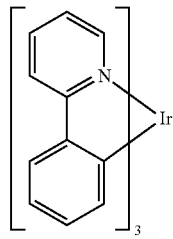

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form. A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions. More details on OLEDs, and the definitions described above, can be found in U.S. Pat. No. 7,279,704, which is incorporated herein by reference in its entirety.

SUMMARY

The present invention provides organic light-emitting devices having a multi-component emissive layer. In one aspect, an organic light-emitting device of the present invention comprises: an anode electrode; a cathode electrode; and an organic electroluminescent layer disposed between the anode electrode and the cathode electrode, the organic electroluminescent layer comprising a phosphorescent dopant and a host material comprising the following three different compounds: (a) an electron-transporting host compound having a triplet energy that is greater than the triplet energy of the phosphorescent dopant; (b) a hole-transporting host compound having a triplet energy that is greater than the triplet energy of the phosphorescent dopant; (c) a wide band gap host compound having a molecular weight of less than 2,000; wherein the wide band gap host compound has a band gap of at least 2.0 eV and a triplet energy that is greater than the triplet energy of the phosphorescent dopant.

In another aspect, the present invention provides a method of making an organic light-emitting device comprising the steps of: providing a first electrode; forming an organic electroluminescent layer over the first electrode, the organic electroluminescent layer comprising a phosphorescent dopant and a host material comprising the following three different compounds: (a) an electron-transporting host compound having a triplet energy that is greater than the triplet energy of the phosphorescent dopant; (b) a hole-transporting host compound having a triplet energy that is greater than the triplet energy of the phosphorescent dopant; (c) a wide band gap host compound having a molecular weight of less than 2,000; wherein the wide band gap host compound has a band gap of at least 2.0 eV and a triplet energy that is greater than the triplet energy of the phosphorescent dopant; forming a second electrode over the organic electroluminescent layer.

BRIEF DESCRIPTION OF THE DRAWINGS

FIG. 6 shows a plot of external quantum efficiency (EQE) vs. luminance for the test devices.

FIG. 7 shows a plot of current density vs. voltage for the tested devices.

FIG. 8 shows the electroluminescent spectrum of the tested devices.

FIG. 9 shows a plot of the luminance decay over time (i.e., device lifetimes) during operation at 40 mA/cm$^2$ of the tested devices.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds. More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at columns 5-6, which are incorporated by reference.

Figure 1:
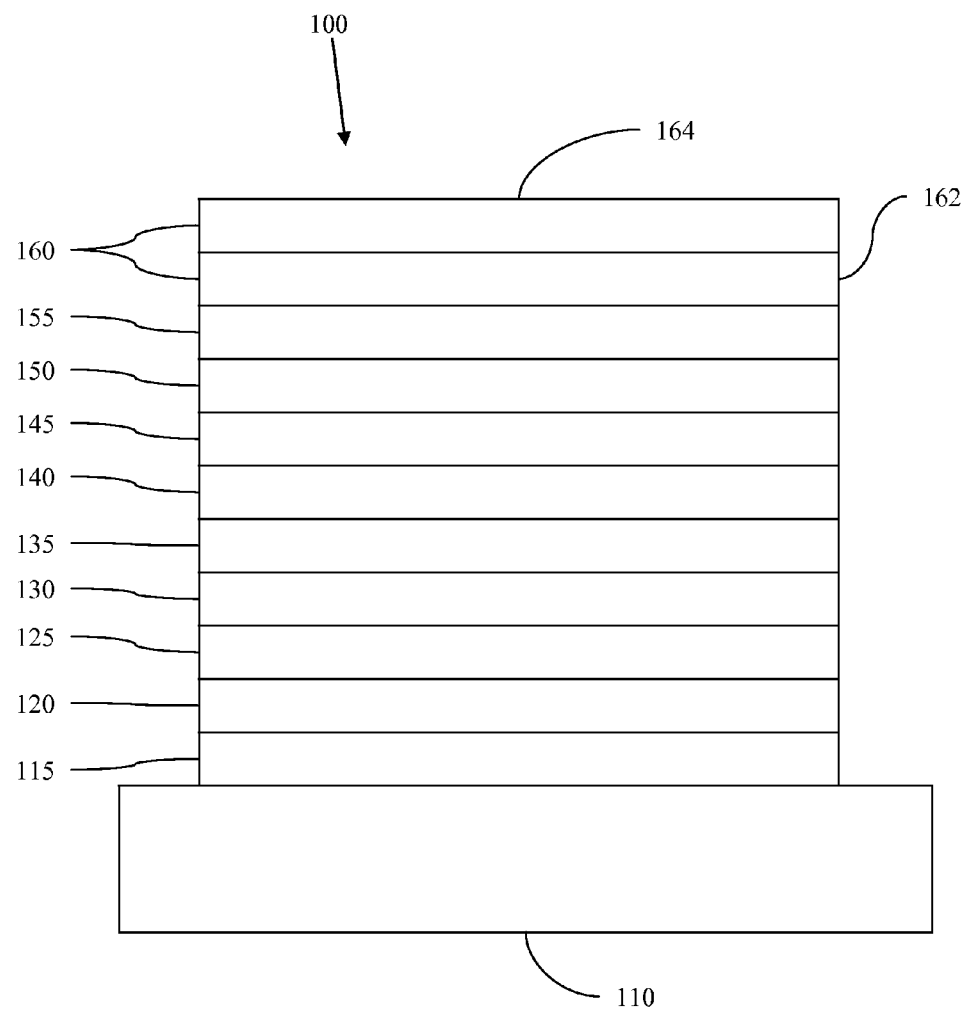
FIG. 1 shows an organic light-emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at columns 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. No. 5,703,436 and No. 5,707, 745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Pat. No. 7,071,615, which is incorporated by reference in its entirety. A description of protective layers may be found in U.S. Pat. No. 7,071,615, which is incorporated by reference in its entirety.

Figure 2:
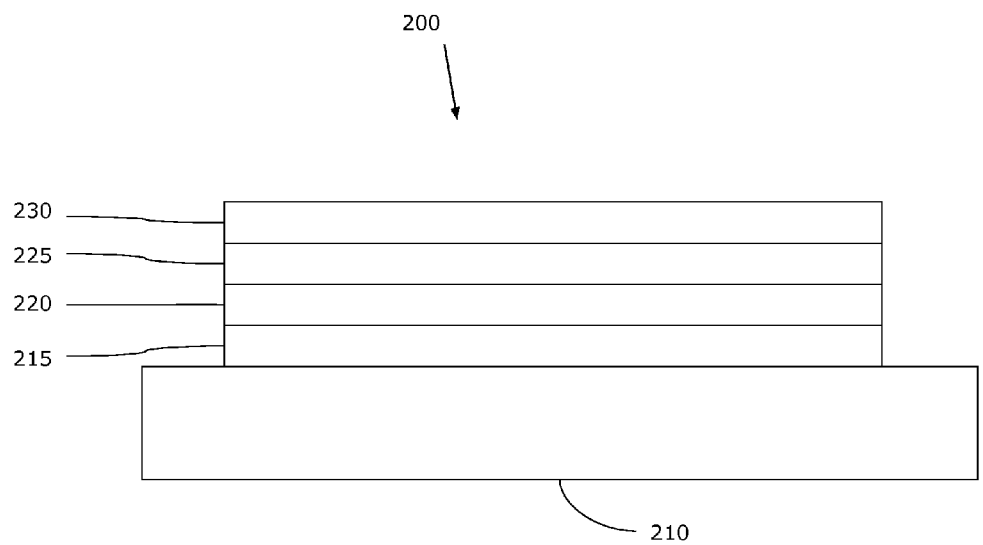
FIG. 2 shows an inverted organic light-emitting device.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. No. 6,013,982 and No. 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. No. 6,294,398 and No. 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20-25° C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at columns 31-32, which are incorporated herein by reference.

The host material of the emissive layer in an organic light-emitting device provides a solid medium for the transport and recombination of charge carriers injected from the anode and the cathode. Compounds used for the host material can be categorized according to their charge transport properties. Some host compounds are predominantly electron-transporting and some others are predominantly hole-transporting. Although host compounds may be characterized as transporting predominantly one type of charge, the compound may also transport charges of both types.

In one aspect, an organic light-emitting device of the present invention has an organic electroluminescent layer comprising a phosphorescent dopant dispersed in a host material. The host material is a mixture of at least three different compounds: a wide band gap host compound, an electron-transporting host compound, and a hole-transporting host compound. The terms "host compound" and "co-host" are used interchangeably herein. The host and co-host compounds have triplet energies greater than the triplet energy of the phosphorescent dopant. This energy configuration allows confinement of the triplet excited states on the dopant. Use of the additional co-hosts in the emissive layer may reduce the interaction of the excitons with the charge carriers, thereby reducing exciton quenching, which may improve device efficiency and/or lifetime.

Additionally, the wide band gap host compound has a HOMO-LUMO band gap of at least 2.0 eV. Depending on the phosphorescent dopant that is used, in some cases, the wide band gap host compound has a HOMO-LUMO band gap of at least 2.5 eV, and in some cases, at least 3.0 eV. In some cases, the HOMO-LUMO band gap of the wide band gap host compound is equal to or greater than that of both the electron-transporting host compound and the hole-transporting host compound. The wide band gap host compound does not readily transport charges of either type in the emissive layer. In particular, the wide band gap host compound has a lower hole mobility than the hole-transporting co-host and a lower electron mobility than the electron-transporting co-host. In some cases, the wide band gap host compound has a molecular weight of less than 2,000; and in some cases, less than 1,500; and in some cases, less than 900. In some cases, the wide band gap host compound is a small molecule. The wide band gap host compound is preferably capable of mixing well with the other components of the emissive layer and capable of promoting the formation of an amorphous film.

Examples of wide band gap compounds suitable for use as the wide band gap host compound include those described in US Patent Application Publication No. 2004/0209115 and No. 2004/0209116 (both by Thompson et al.). In some cases, the wide band gap host compound contains at least one of the following moieties in the molecule:

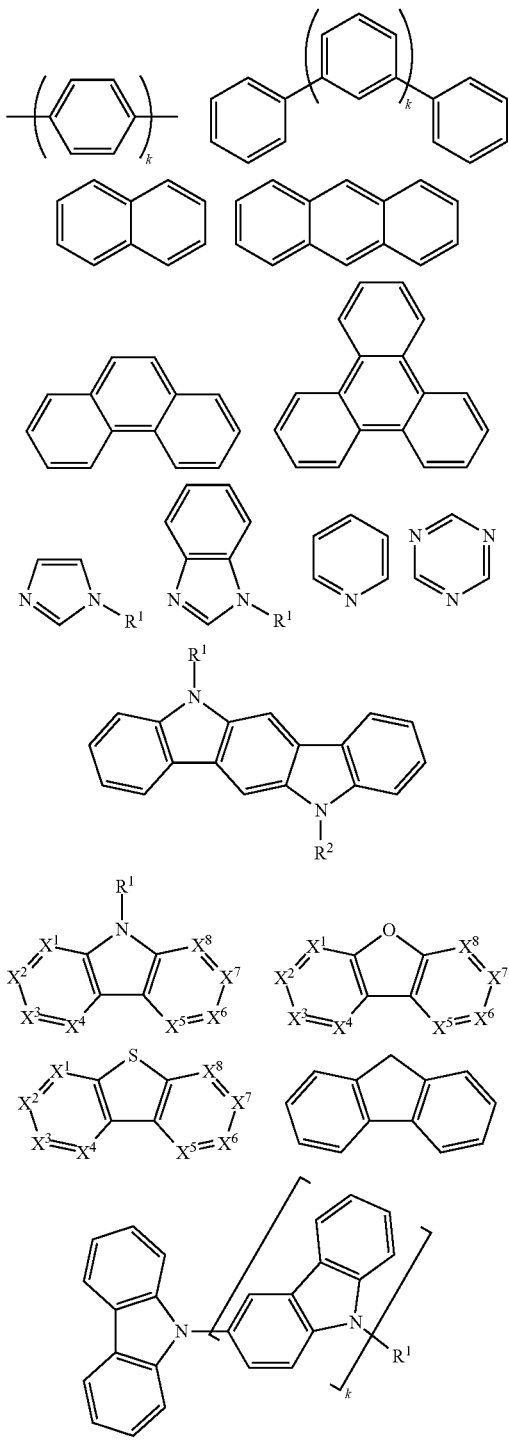

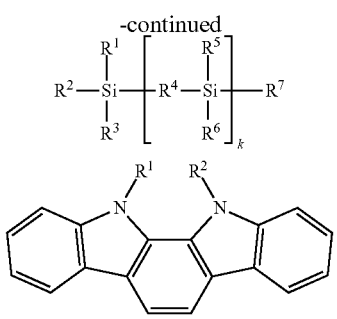

In the above chemical structures, $R^1$ to $R^7$ is each independently hydrogen, deuterium, alkyl, alkoxy, amino, alkenyl, alkynyl, arylalkyl, heteroalkyl, aryl, or heteroaryl; k is an integer from 0 to 20; and $X^1$ to $X^8$ is each independently CH or N. Specific examples of organic compounds that can serve as the wide band gap host compound include the following:

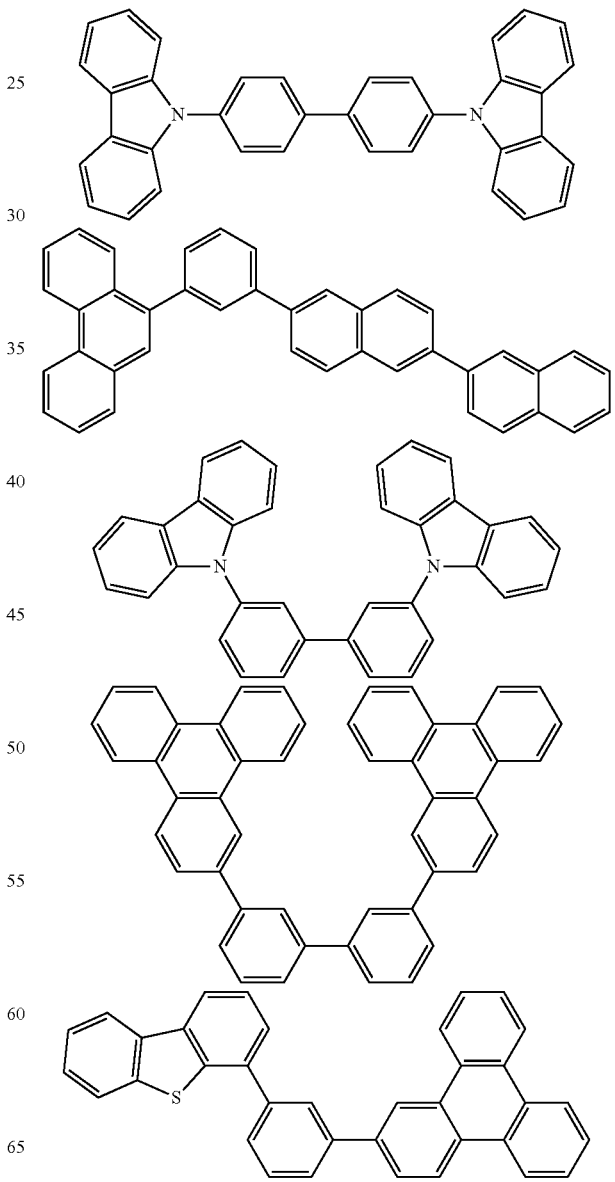

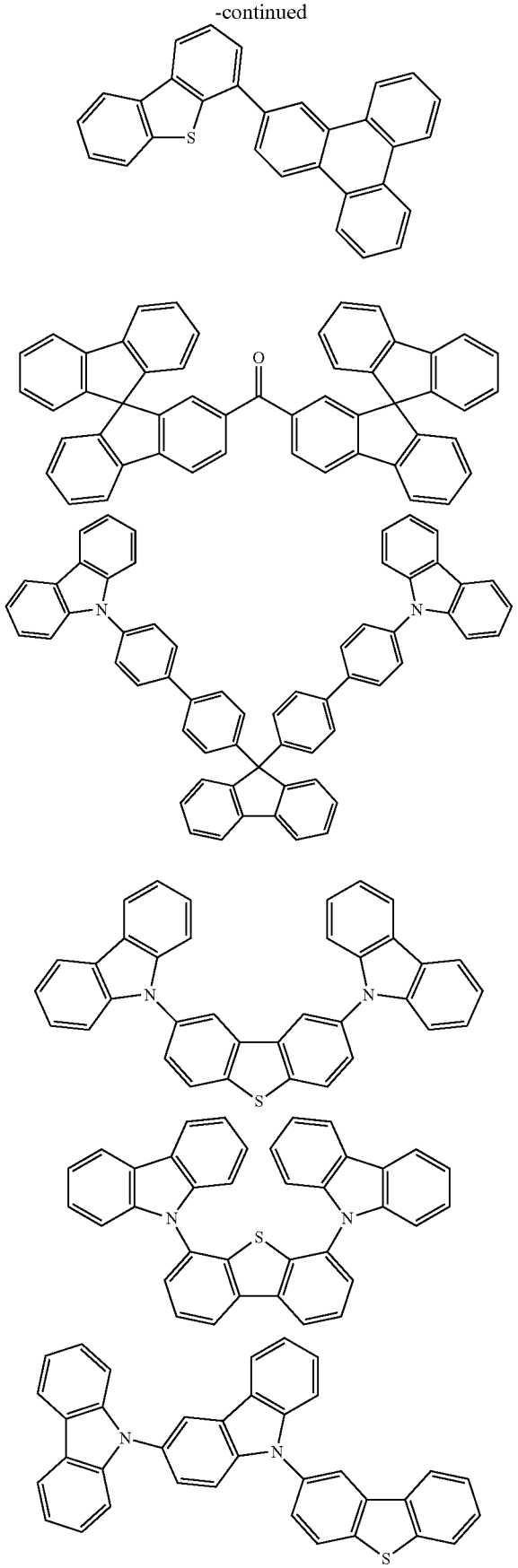

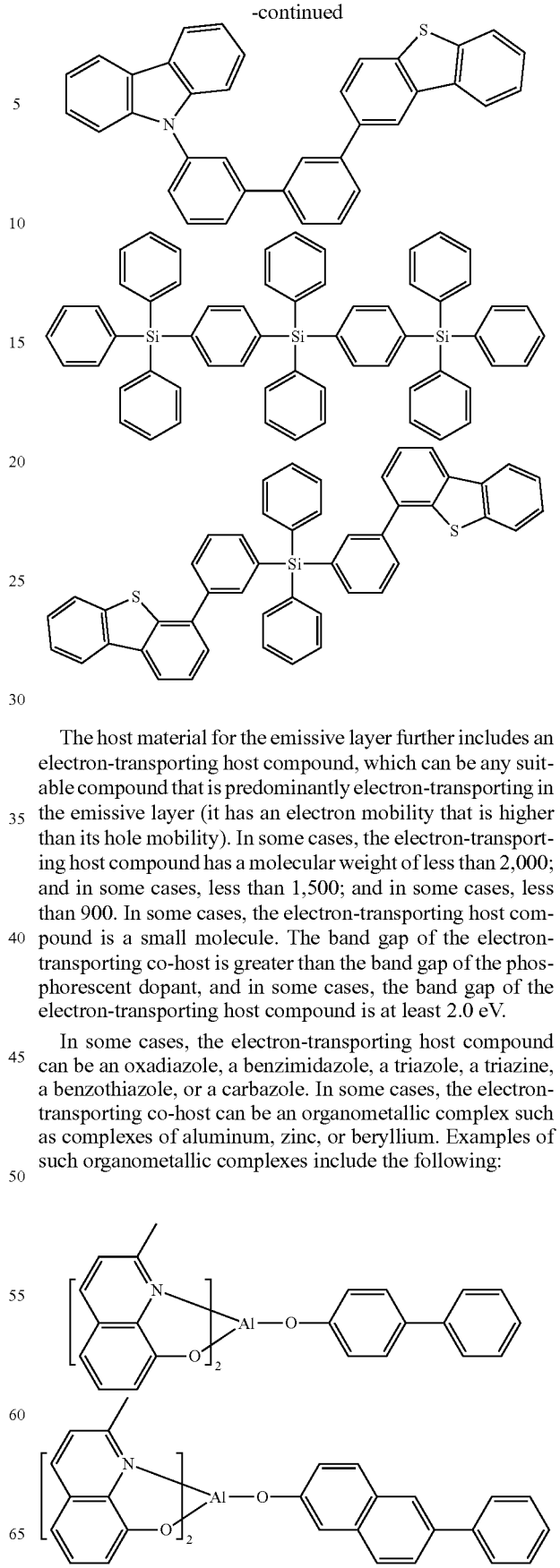

The host material for the emissive layer further includes an electron-transporting host compound, which can be any suitable compound that is predominantly electron-transporting in the emissive layer (it has an electron mobility that is higher than its hole mobility). In some cases, the electron-transporting host compound has a molecular weight of less than 2,000; and in some cases, less than 1,500; and in some cases, less than 900. In some cases, the electron-transporting host compound is a small molecule. The band gap of the electron-transporting co-host is greater than the band gap of the phosphorescent dopant, and in some cases, the band gap of the electron-transporting host compound is at least 2.0 eV.

In some cases, the electron-transporting host compound can be an oxadiazole, a benzimidazole, a triazole, a triazine, a benzothiazole, or a carbazole. In some cases, the electron-transporting co-host can be an organometallic complex such as complexes of aluminum, zinc, or beryllium. Examples of such organometallic complexes include the following:

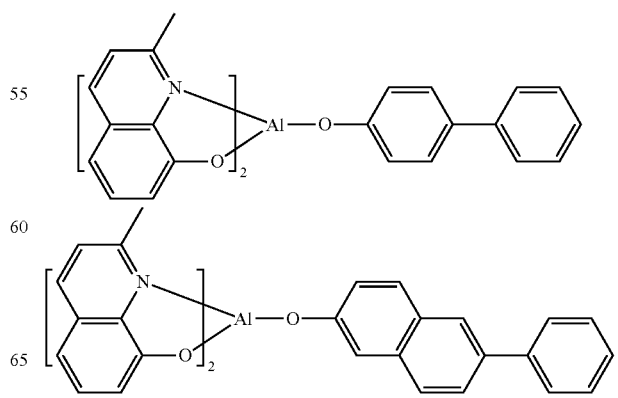

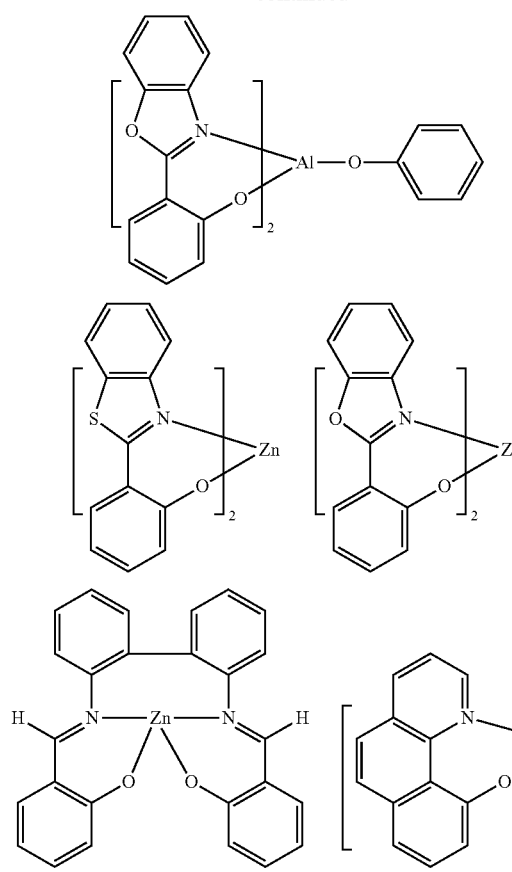
In some cases, the electron-transporting co-host is an organic compound that includes at least one of the following moieties in the molecule:
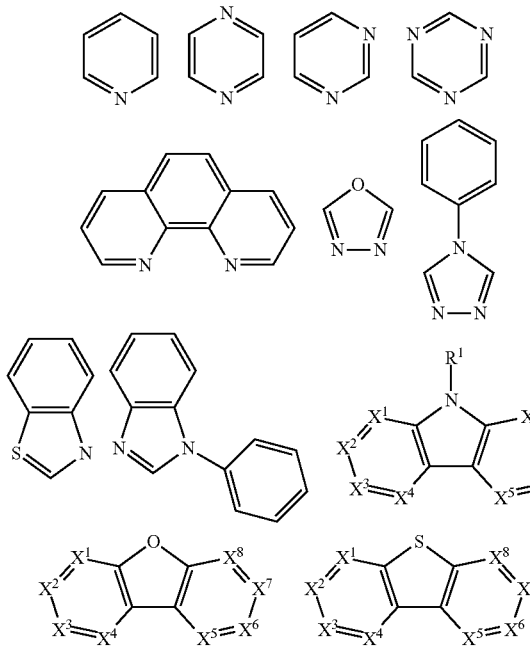
In the above chemical structures, $X^1$ to $X^8$ is CH or N, with at least one of $X^1$ to $X^8$ being N. Specific examples of organic compounds that can serve as the electron-transporting co-host include the following:
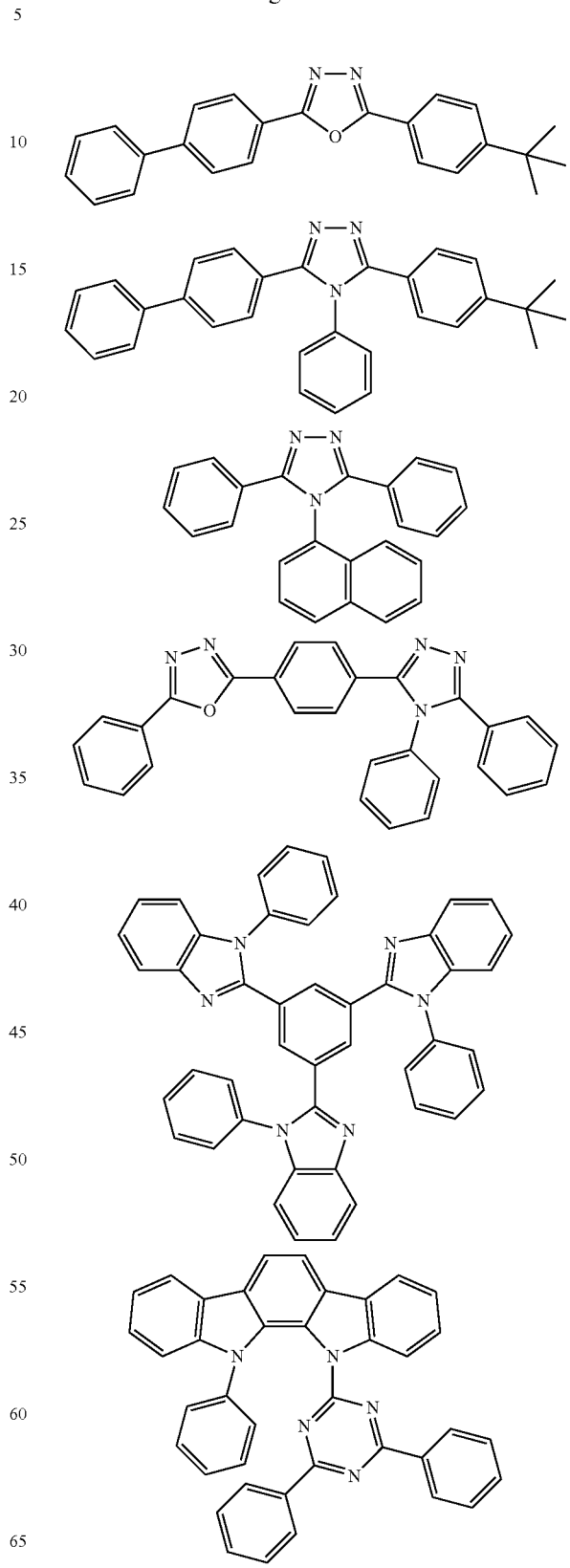

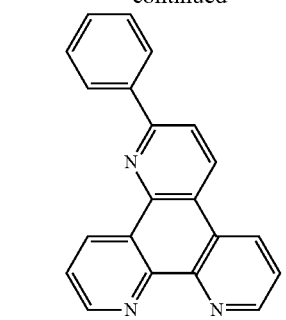
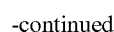
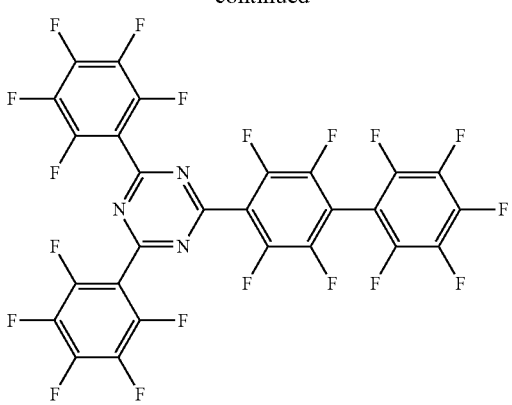
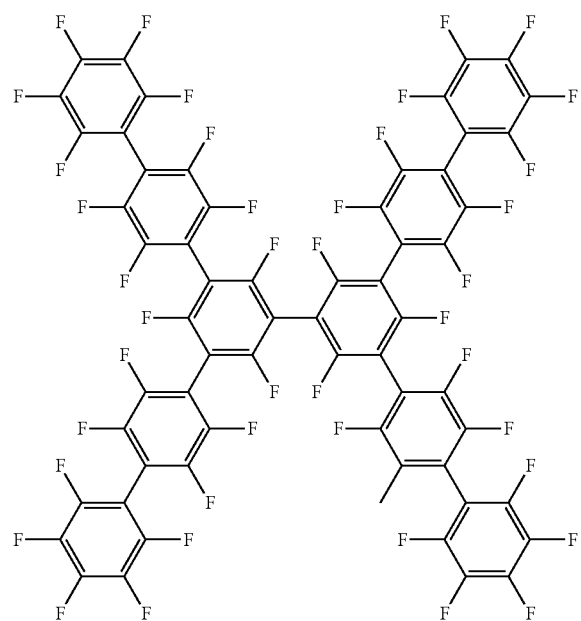

The host material for the emissive layer further includes a hole-transporting host compound, which can be any suitable compound that is predominantly hole-transporting in the emissive layer (it has a hole mobility that is greater than its electron mobility). In some cases, the hole-transporting host compound has a molecular weight of less than 2,000; and in some cases, less than 1,500; and in some cases, less than 900. In some cases, the hole-transporting host compound is a small molecule. The band gap of the hole-transporting co-host is greater than the band gap of the phosphorescent dopant, and in some cases, the band gap of the hole-transporting host compound is at least 2.0 eV. In some cases, the LUMO energy level of the electron-transporting host compound is equal to or lower (equally as or more electronegative) than the LUMO energy level of the hole-transporting host compound. In some cases, the HOMO energy level of the hole-transporting host compound is equal to or higher (equally as or less electronegative) than the HOMO energy level of the electron-transporting host compound. Methods for estimating HOMO and LUMO levels for organic compounds are well-known in the art, such as the methods described in U.S. Pat. No. 7,045,952, and can be calculated using commercially available software packages, such as the Gaussian software programs for electronic structure modeling.

In some cases, the hole-transporting co-host can be an organometallic complex such as complexes of iridium or zinc. Examples of organometallic complexes that can serve as the hole-transporting co-host include the following:

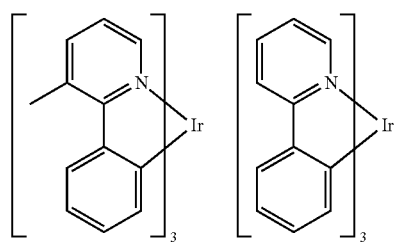

-continued
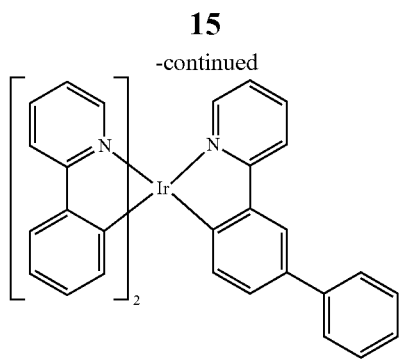
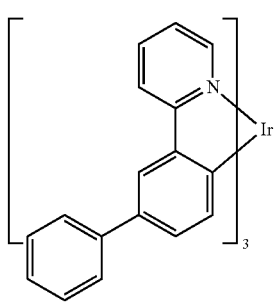
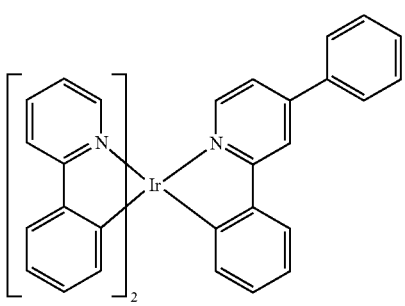
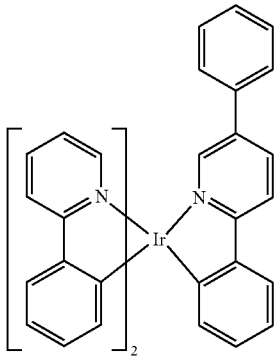
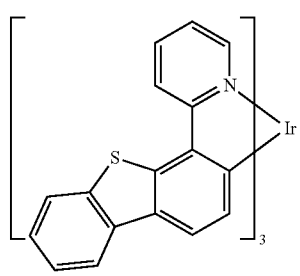
-continued
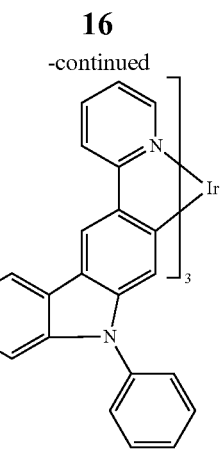
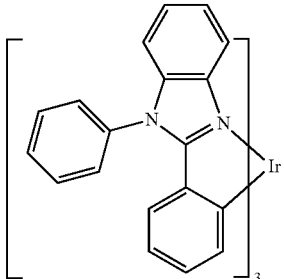
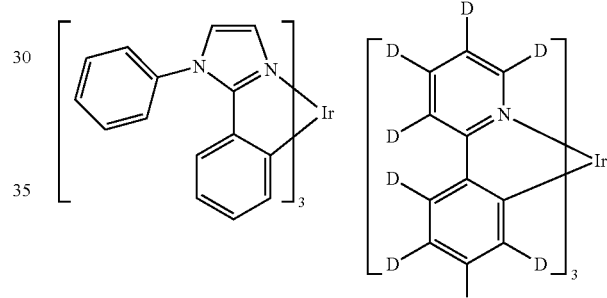
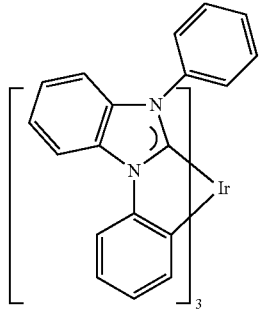
In some cases, the hole-transporting co-host is a carbazole or triarylamine compound, such as those that include at least one of the following moieties in the molecule:
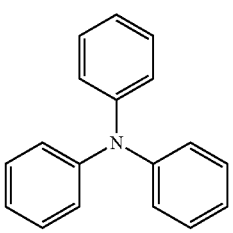 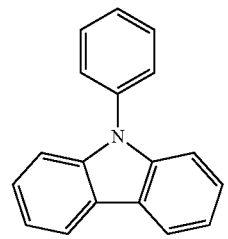

Specific examples of organic compounds that can serve as the hole-transporting co-host include the following:
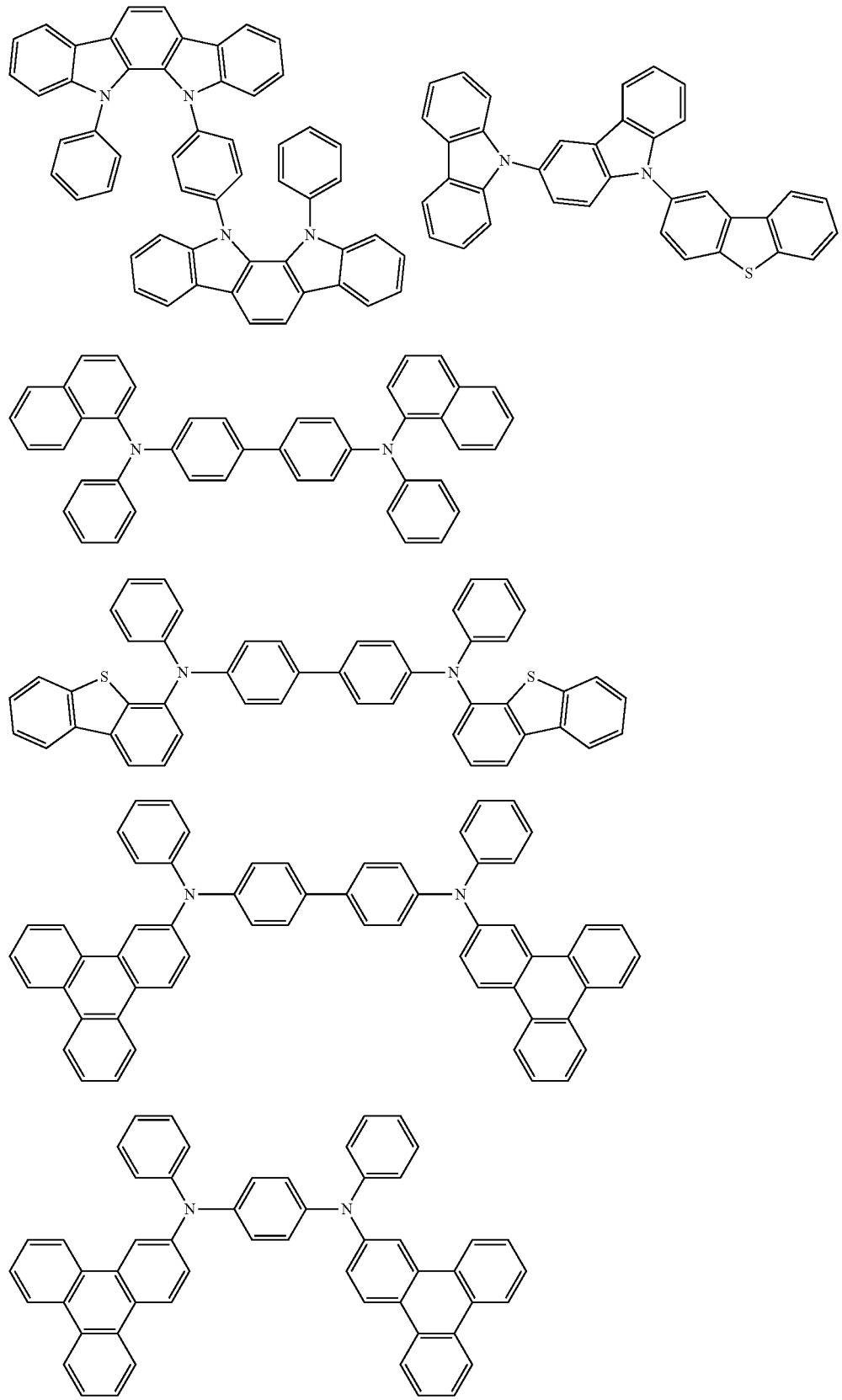

-continued
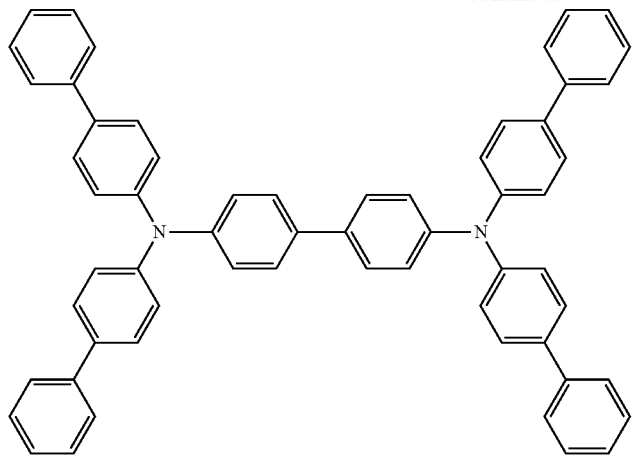
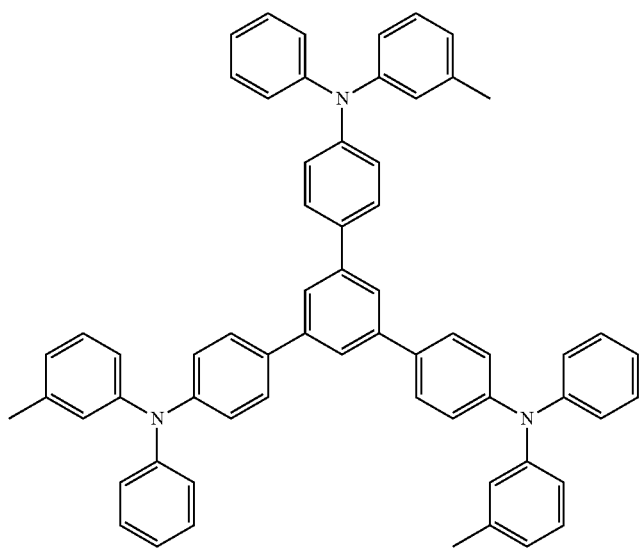
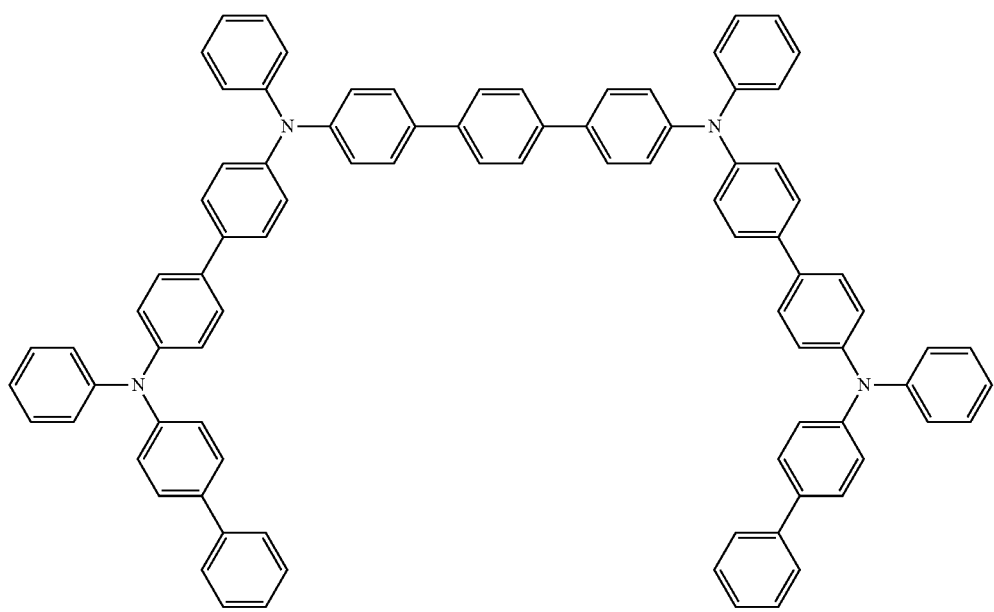

-continued

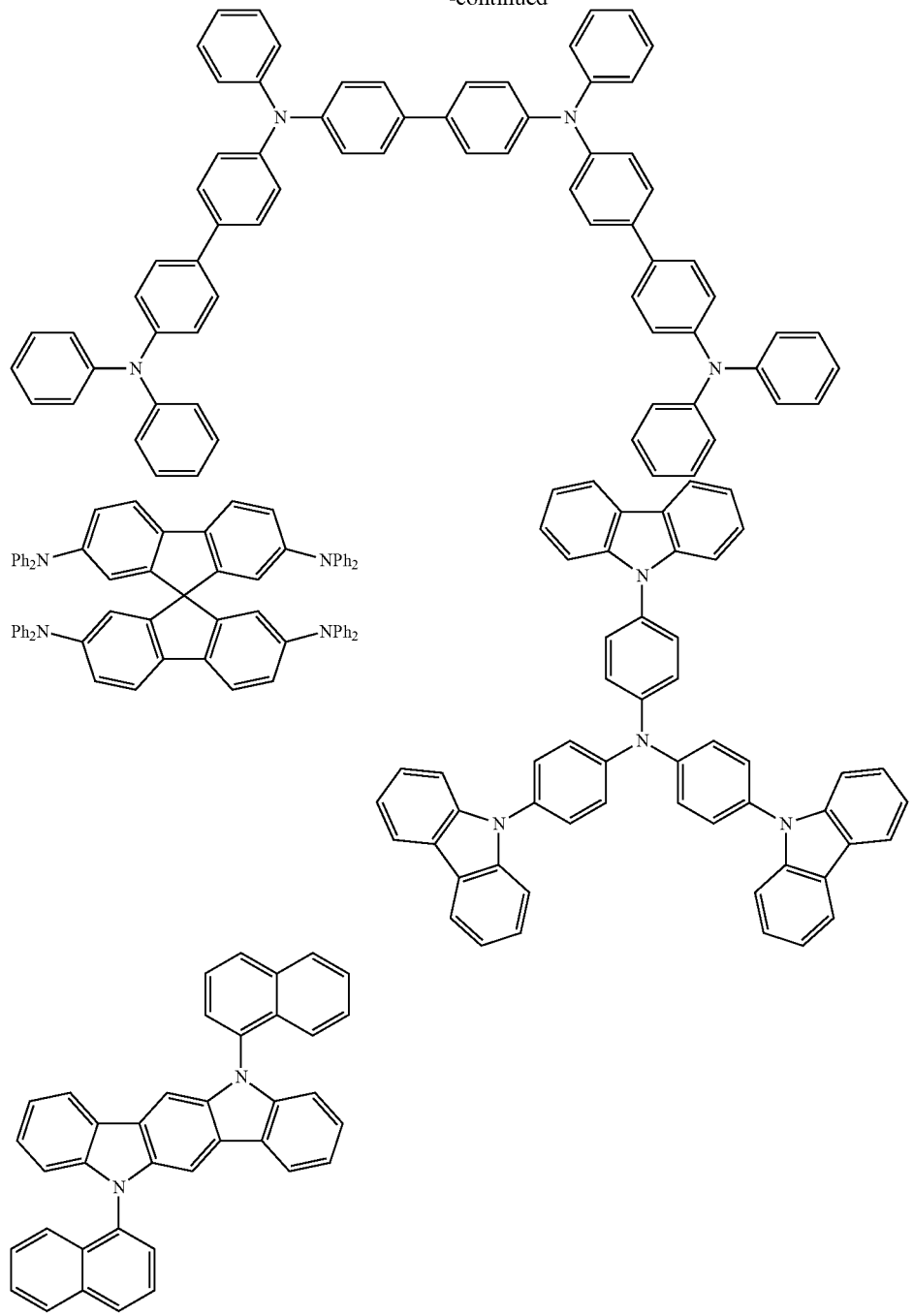

Any suitable phosphorescent dopant may be used in the emissive layer, including those listed in Table 3 below. The selection of the co-hosts will vary depending on the selection of the phosphorescent dopant. In some embodiments, the electroluminescent layer contains additional dopants. For example, the electroluminescent layer may include a first phosphorescent dopant as a sensitizer dopant and a second dopant as an emitter, which may be phosphorescent or fluorescent. The sensitizer dopant serves to assist in the energy transfer from the host to the emitter dopant. In this case, the emitter dopant has a triplet energy that is lower than the triplet energy of the sensitizer dopant, which is lower than the triplet energy of the host compounds. The use of multiple dopants in this manner may be useful for tuning emission color, prolonging lifetime, and/or improving device efficiency.

The relative amounts of the dopant, the wide band gap host compound, the electron-transporting host compound, and the hole-transporting host compound will vary depending upon the particular application. Using the mixed host material of the present invention may allow for a reduced concentration of the dopant in the emissive layer. In some cases, the dopant is present in an amount of 0.5-10 wt % of the emissive layer, the wide band gap host compound is present in an amount of 10-60 wt %, the electron-transporting host compound is present in an amount of 10-60 wt %, and hole-transporting host compound is present in an amount of 10-60 wt %. But other concentrations are also possible. If there are multiple dopants, each dopant may be present in an amount of 0.5-10 wt % of the emissive layer.

The compounds for the emissive layer may be deposited using any suitable deposition technique, including vapor-phase deposition techniques such as vacuum thermal evaporation. The different compounds in the emissive layer may be deposited separately or in combination. For example, each compound may be deposited at individually controlled rates, or alternatively, two or more of the host compounds may be pre-mixed and then be evaporated together.

EXPERIMENTAL

Figure 3:
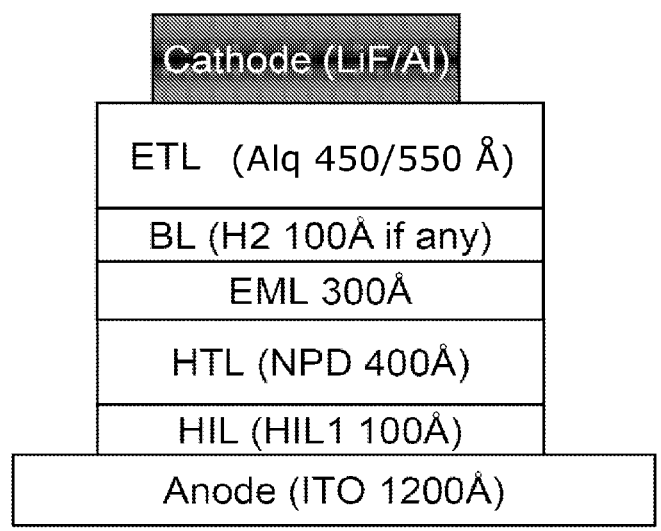
FIG. 3 shows the architecture of the experimental and comparative devices.
Figure 4:
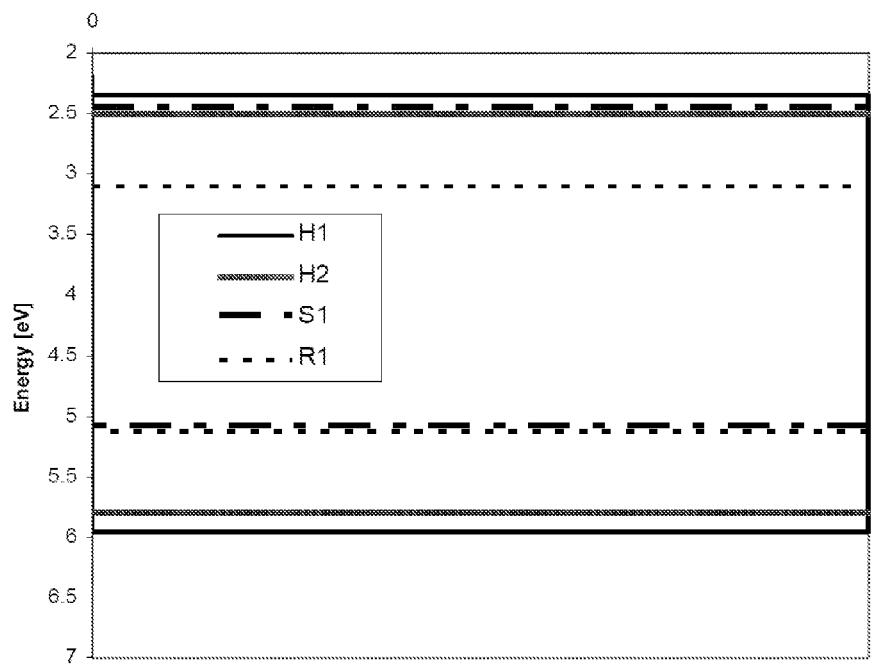
FIG. 4 shows the HOMO-LUMO energy levels of the compounds used in the device of Example 1.
Figure 10:
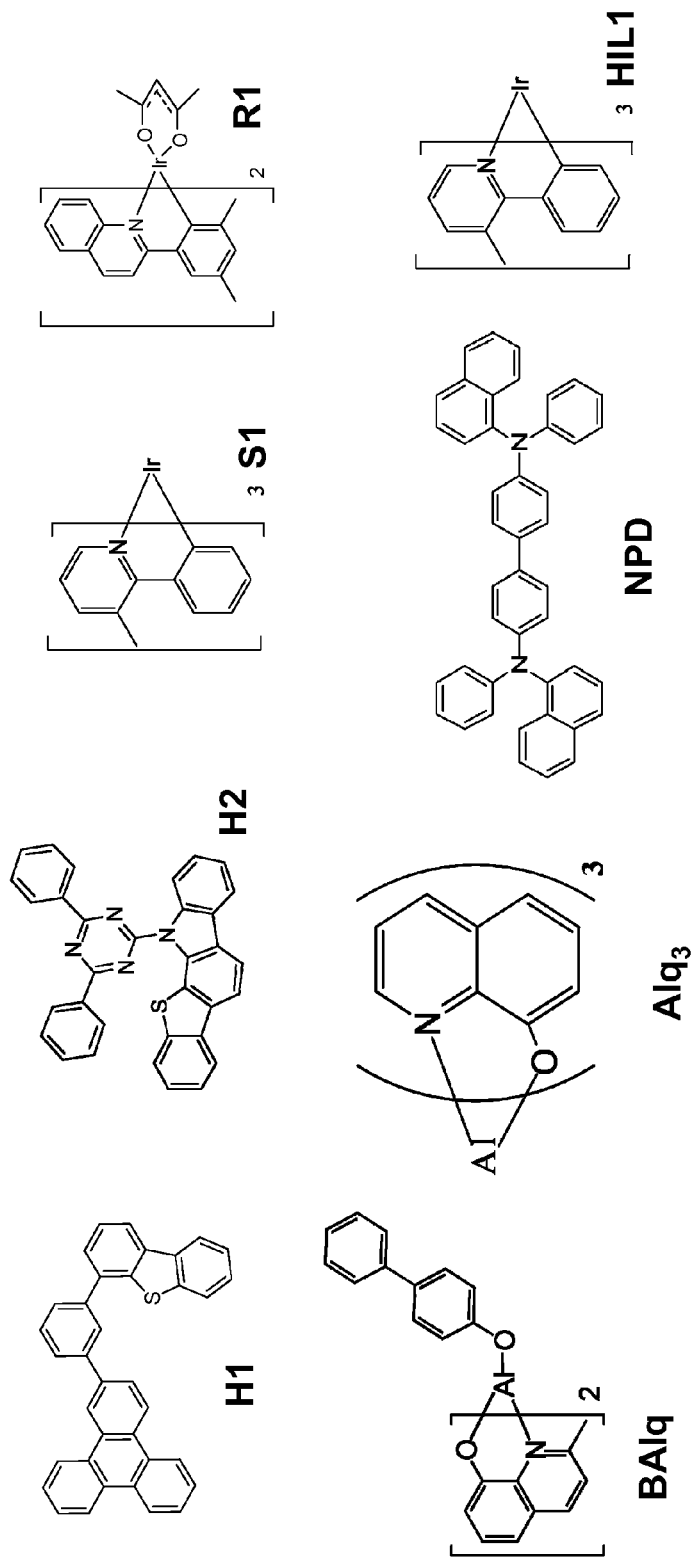
FIG. 10 shows the chemical structure of the compounds used in making the tested devices.

An experimental device (Example 1) having the architecture shown in FIG. 3 was constructed. FIG. 10 shows the chemical structure of some of the compounds used in making the device. The device had an ITO anode and a LiF/Al cathode. Sandwiched between the anode and the cathode were: 100 Å thickness hole injection layer made of the compound HIL-1, a 400 Å thickness hole transport layer made of NPD, a 300 Å thickness emissive layer, a 100 Å thickness blocking layer made of the compound H2, and a 450 Å thickness electron transport layer made of Alq. The emissive layer was made using the compound H2 as a host, the compound H1 as a co-host at a concentration of 40 wt %, the compound S1 as a co-host at a concentration of 20 wt %, and a dopant R1 at a concentration of 4 wt %. The HOMO-LUMO energy levels of these compounds are shown in FIG. 4 and Table 1 below. The emissive layer was deposited by vacuum thermal evaporation of these compounds at individually controlled rates.

TABLE 1

| Compound | LUMO [eV] | HOMO [eV] |
|---|---|---|
| H1 | 2.34 | 5.96 |
| H2 | 2.50 | 5.79 |
| S1 | 2.45 | 5.06 |
| R1 | 3.1 | 5.13 |

Comparative devices CE 1-4 had the same architecture as experimental device Example 1, except that the composition of the emissive layer was different. Comparative device CE 5 had the same architecture as experimental device Example 1, except that the blocking layer was omitted, the electron transport layer had a thickness of 550 Å, and the composition of the emissive layer was different. Table 2 below shows the composition of the emissive layer in these devices.

These devices were subjected to various testing protocols to evaluate their performance. FIG. 8 shows the electroluminescent spectrum of the light emitted from these devices. Table 2 below displays the 1931 CIE color space coordinates, $\lambda_{max}$, and full-width at half-maximum (FHWM) of the emission peak. These data show that the spectral characteristics of the emitted light were not significantly changed in the experimental device of Example 1 as compared to the comparative devices.

Figure 5:
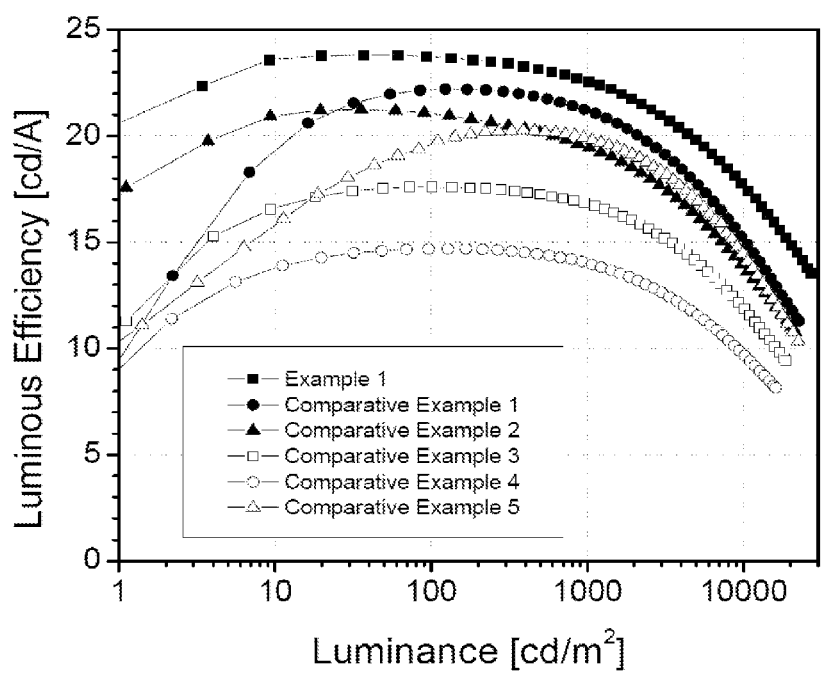
FIG. 5 shows a plot of luminous efficiency vs. luminance for the tested devices.

FIG. 5 shows a plot of luminous efficiency vs. luminance for the test devices. As seen here, experimental device Example 1 has a higher luminous efficiency over a wide range of luminance levels. This improved luminous efficiency is also demonstrated in Table 2 in the column for LE (luminance efficiency) for device operation at 1,000 nits and 10,000 nits.

FIG. 6 shows a plot of external quantum efficiency (EQE) vs. luminance for the tested devices. As seen here, experimental device Example 1 has a higher external quantum efficiency over a wide range of luminance levels. This improved external quantum efficiency is also demonstrated in Table 2 in the column for EQE for device operation at 1,000 nits and 10,000 nits.

FIG. 7 shows a plot of current density vs. voltage (i.e., J-V plots) for the tested devices. As seen here, experimental device Example 1 has J-V characteristics comparable to that of the comparative devices. Table 2 also demonstrates the improved power efficiency (PE) for experimental device Example 1 during operation at 1,000 nits and 10,000 nits.

FIG. 9 shows a plot of the decay of luminance over time (i.e., device lifetimes) during operation at room temperature at a constant DC current density of 40 mA/cm² for the tested devices. Table 2 also displays the number of hours of operation before the luminance decayed to 95% of the initial level (LT95%). Because the devices have different luminous efficiencies, each device's initial luminance at 40 mA/cm² is also shown in Table 2. For a comparison of device stability, LT95% at the same luminance of 10,000 nits was calculated assuming an acceleration factor of 2 from the LT95% and initial luminance of the devices when operated at 40 mA/cm². These data show that devices of the present invention can have improved operating efficiencies and longer lifetimes. These improvements are particularly dramatic at higher luminance levels (e.g., at 10,000 nits), where there is a higher degree of exciton quenching in the emissive layer.

TABLE 2

| | Device structure | | | | | 1931 CIE | | λ max | FWHM |
|---|---|---|---|---|---|---|---|---|---|
| Device Example | Host | H1 [%] | S1 [%] | R1 [%] | BL | x | y | [nm] | [nm] |
| 1 | H2 | 40 | 20 | 4 | H2 | 0.654 | 0.342 | 620 | 60 |
| CE 1 | H2 | | 20 | 4 | H2 | 0.660 | 0.337 | 620 | 60 |
| CE 2 | H1 | | 20 | 4 | H2 | 0.653 | 0.343 | 620 | 60 |
| CE 3 | H2 | | | 12 | H2 | 0.671 | 0.326 | 624 | 62 |
| CE 4 | H1 | | | 12 | H2 | 0.671 | 0.326 | 626 | 66 |
| CE 5 | BAlq | | | 7 | none | 0.667 | 0.331 | 622 | 62 |

| | At 1,000 nits | | | | At 10,000 nits | | | | 40 mA/cm² | | |
|---|---|---|---|---|---|---|---|---|---|---|---|
| Example | Voltage [V] | LE [cd/A] | EQE [%] | PE [lm/W] | Voltage [V] | LE [cd/A] | EQE [%] | PE [lm/W] | LT95% [h] | $L_0$ [nits] | LT95% [h] |
| 1 | 7.0 | 22.6 | 19.0 | 10.1 | 11.2 | 17.7 | 14.9 | 4.9 | 120 | 7,453 | 216 |
| CE 1 | 6.8 | 21.2 | 18.6 | 9.7 | 11.0 | 15.1 | 13.3 | 4.3 | 55 | 6,699 | 122 |
| CE 2 | 6.8 | 19.5 | 16.4 | 8.9 | 11.1 | 13.9 | 11.7 | 3.9 | 29 | 6,216 | 75 |
| CE 3 | 7.0 | 16.8 | 17.3 | 7.6 | 11.6 | 11.9 | 12.2 | 3.2 | 22 | 5,522 | 71 |

TABLE 2-continued

| CE 4 | 7.1 | 14.0 | 14.7 | 6.2 | 11.8 | 9.7  | 10.2 | 2.6 | 14 | 4,696 | 64 |
| CE 5 | 8.1 | 19.9 | 18.8 | 7.7 | 12.8 | 14.4 | 13.7 | 3.5 | 37 | 6,447 | 90 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

TABLE 3

Examples of phosphorescent dopants

| MATERIAL | EXAMPLES OF MATERIAL | PUBLICATIONS |
| --- | --- | --- |
| Red dopants | | |
| Heavy metal porphyrins (e.g., PtOEP) | 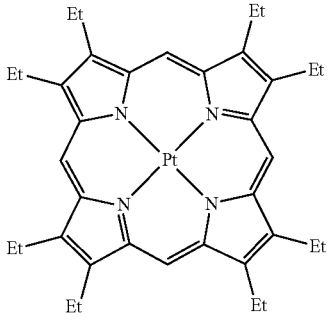 | Nature 395, 151 (1998) |
| Iridium(III) organometallic complexes | 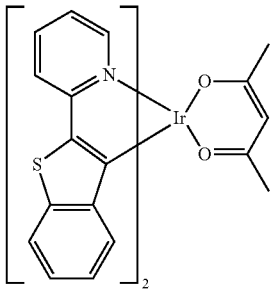 | Appl. Phys. Lett. 78, 1622 (2001) |
|  | 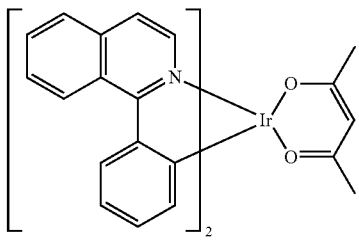 | US 2006/835469 |
|  | 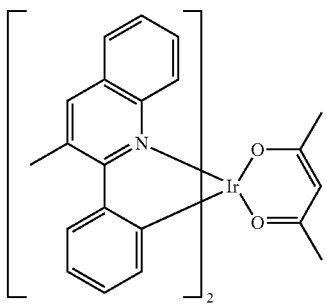 | US 2006/835469 |

TABLE 3-continued

Examples of phosphorescent dopants

| MATERIAL | EXAMPLES OF MATERIAL | PUBLICATIONS |
|---|---|---|
| | | US 2006/0202194 |
| | | US 2006/0202194 |
| | | US 2007/0087321 |
| | | US 2007/0087321 |
| | | Adv. Mater. 19, 739 (2007) |

TABLE 3-continued

Examples of phosphorescent dopants

| MATERIAL | EXAMPLES OF MATERIAL | PUBLICATIONS |
| --- | --- | --- |
| | | WO 2009/100991 |
| | | WO 2008/101842 |
| Platinum(II) organometallic complexes | | WO 2003/040257 |
| Osminum(III) complexes | | Chem. Mater. 17, 3532 (2005) |
| Ruthenium(II) complexes | | Adv. Mater. 17, 1059 (2005) |

TABLE 3-continued
Examples of phosphorescent dopants
| MATERIAL | EXAMPLES OF MATERIAL | PUBLICATIONS |
|---|---|---|
| Rhenium (I), (II), and (III) complexes | 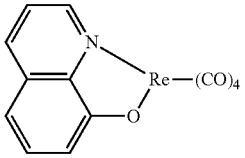 | US 2005/0244673 |
Green dopants
| | | |
|---|---|---|
| Iridium(III) organometallic complexes | 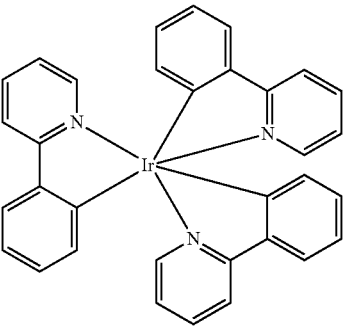<br>and its derivatives | Inorg. Chem. 40, 1704 (2001) |
| | 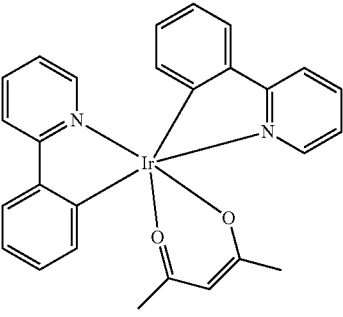 | US 2002/0034656 |
| | 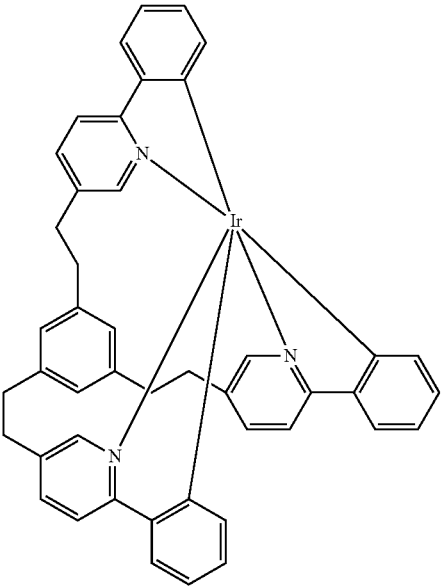 | US 7332232 |

TABLE 3-continued

Examples of phosphorescent dopants

| MATERIAL | EXAMPLES OF MATERIAL | PUBLICATIONS |
|---|---|---|
| | | US 2009/0108737 |
| | | US 2009/0039776 |
| | | US 6921915 |
| | | US 6687266 |
| | | Chem. Mater. 16, 2480 (2004) |

TABLE 3-continued

Examples of phosphorescent dopants

| MATERIAL | EXAMPLES OF MATERIAL | PUBLICATIONS |
|---|---|---|
| | | US 2007/0190359 |
| | | US 2006/0008670<br>JP 2007-123392 |
| | | Adv. Mater. 16, 2003 (2004) |
| | | Angew. Chem. Int. Ed. 2006, 45, 7800 |
| | | WO 2009/050290 |
| | | US 2009/0165846 |

TABLE 3-continued

Examples of phosphorescent dopants

| MATERIAL | EXAMPLES OF MATERIAL | PUBLICATIONS |
| --- | --- | --- |
|  |  | US 2008/0015355 |
| Monomer for polymeric metal organometallic compounds |  | US 7250226, US 7396598 |
| Pt(II) organometallic complexes, including polydentated ligands |  | Appl. Phys. Lett. 86, 153505 (2005) |
|  |  | Appl. Phys. Lett. 86, 153505 (2005) |

TABLE 3-continued
| | Examples of phosphorescent dopants | |
|---|---|---|
| MATERIAL | EXAMPLES OF MATERIAL | PUBLICATIONS |
| | 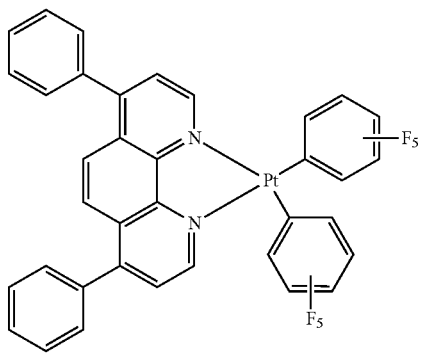 | Chem. Lett. 34, 592 (2005) |
| | 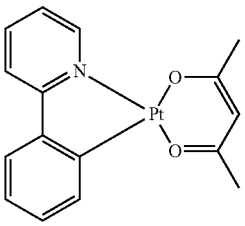 | WO 2002/015645 |
| | 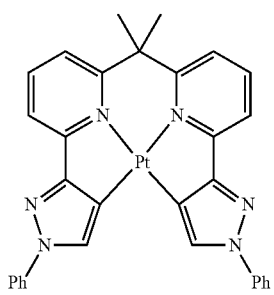 | US 2006/0263635 |
| Cu complexes | 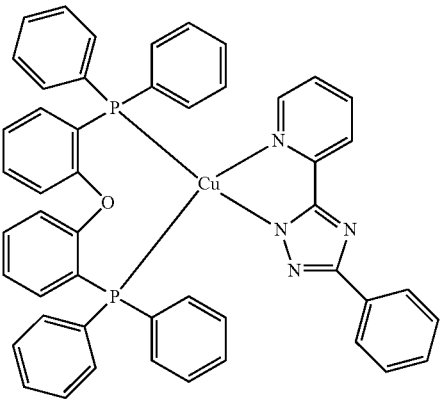 | WO 2009/000673 |

TABLE 3-continued
Examples of phosphorescent dopants
| MATERIAL | EXAMPLES OF MATERIAL | PUBLICATIONS |
|---|---|---|
| Gold complexes | 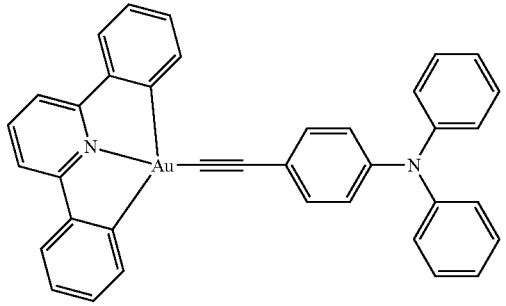 | Chem. Commun. 2906 (2005) |
| Rhenium(III) complexes | 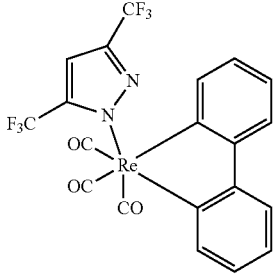 | Inorg. Chem. 42, 1248 (2003) |
| Deuterated organometallic complexes | 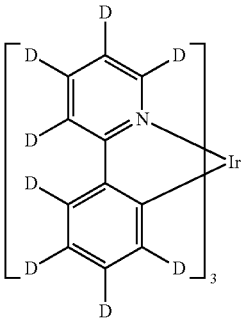 | US 2003/0138657 |
| Organometallic complexes with two or more metal centers | 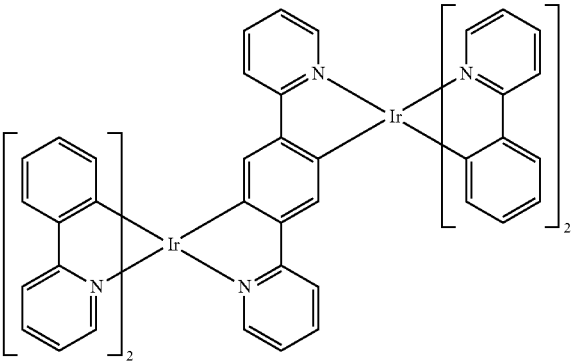 | US 2003/0152802 |

TABLE 3-continued
Examples of phosphorescent dopants
| MATERIAL | EXAMPLES OF MATERIAL | PUBLICATIONS |
|---|---|---|
| | 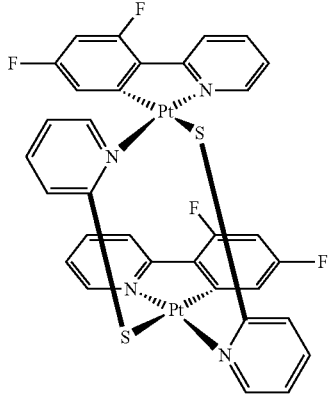 | US 7090928 |
Blue dopants
| Iridium(III) organometallic complexes | 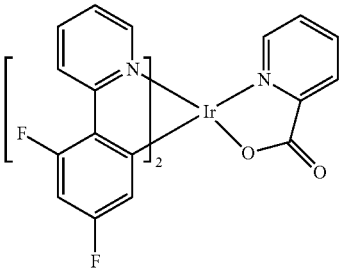 | WO 2002/002714 |
| | 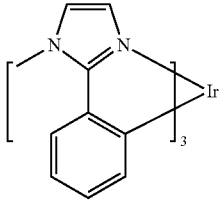 | WO 2006/009024 |
| | 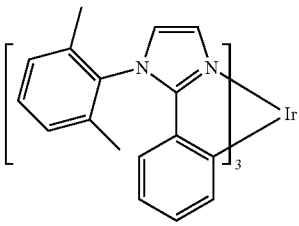 | US 2006/0251923 |
| | 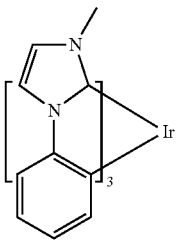 | US 7393599, WO 2006/056418, US 2005/0260441, WO 2005/019373 |

TABLE 3-continued

Examples of phosphorescent dopants

| MATERIAL | EXAMPLES OF MATERIAL | PUBLICATIONS |
|---|---|---|
| | (structure) | US 7534505 |
| | (structure) | US 7445855 |
| | (structure) | US 20070190359, US 2008/0297033 |
| | (structure) | US 7338722 |
| | (structure) | US 2002/0134984 |

TABLE 3-continued
| Examples of phosphorescent dopants | | |
|---|---|---|
| MATERIAL | EXAMPLES OF MATERIAL | PUBLICATIONS |
| | 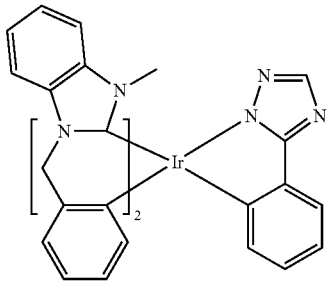 | Angew. Chem. Int. Ed. 47, 1 (2008) |
| | 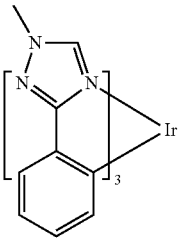 | Chem. Mater. 18, 5119 (2006) |
| | 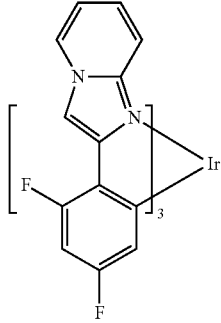 | Inorg. Chem. 46, 4308 (2007) |
| | 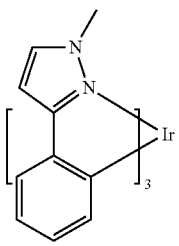 | WO 2005/123873 |
| | 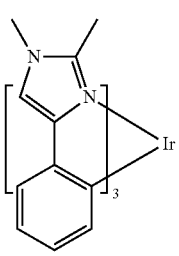 | WO 2005/123873 |

TABLE 3-continued
| | Examples of phosphorescent dopants | |
|---|---|---|
| MATERIAL | EXAMPLES OF MATERIAL | PUBLICATIONS |
| | 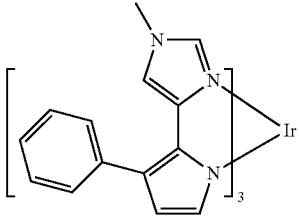 | WO 2007/004380 |
| | 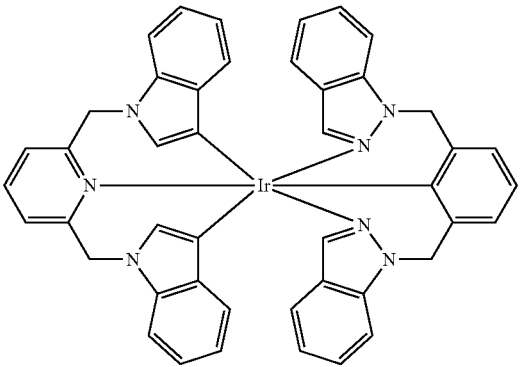 | WO 2006/082742 |
| Osmium(II) complexes | 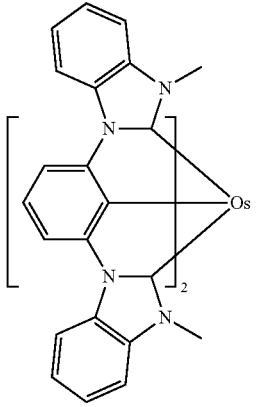 | US 7279704 |
| | 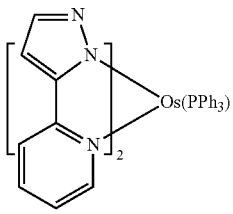 | Organometallics 23, 3745 (2004) |
| Gold complexes | 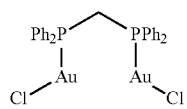 | Appl. Phys. Lett. 74, 1361 (1999) |

We claim:

1. An organic light-emitting device comprising:
   an anode electrode;
   a cathode electrode; and
   an organic electroluminescent layer disposed between the anode electrode and the cathode electrode, the organic electroluminescent layer comprising a phosphorescent dopant and a host material comprising the following three different compounds:
   (a) an electron-transporting host compound having a triplet energy that is greater than the triplet energy of the phosphorescent dopant;
   (b) a hole-transporting host compound having a triplet energy that is greater than the triplet energy of the phosphorescent dopant;
   (c) a wide band gap host compound having a molecular weight of less than 2,000;
   wherein the wide band gap host compound has a band gap of at least 2.0 eV and a triplet energy that is greater than the triplet energy of the phosphorescent dopant,
   wherein the hole-transporting host compound is an organometallic complex.

2. The device of claim 1, wherein the wide band gap host compound has a band gap that is equal to or greater than the band gap of the hole-transporting host compound and the band gap of the electron-transporting host compound.

3. The device of claim 1, wherein the LUMO energy level of the electron-transporting host compound is equal to or lower than the LUMO energy level of the hole-transporting host compound.

4. The device of claim 1, wherein the HOMO energy level of the hole-transporting host compound is equal to or higher than the HOMO energy level of the electron-transporting host compound.

5. The device of claim 1, wherein the wide band gap host compound is a small molecule.

6. The device of claim 1, wherein the organometallic complex is an iridium complex or zinc complex.

7. The device of claim 1, wherein the electron-transporting host compound is an oxadiazole, a benzimidazole, a triazole, a triazine, a benzothiazole, or a carbazole compound.

8. The device of claim 1, wherein the electron-transporting host compound is an organometallic complex.

9. The device of claim 8, wherein the organometallic complex is an aluminum complex, zinc complex, or beryllium complex.

10. The device of claim 1, further comprising a blocking layer that is between the electroluminescent layer and the cathode, the blocking layer comprising the electron-transporting host compound.

11. The device of claim 1, further comprising a hole injection layer that is between the electroluminescent layer and the anode, the hole injection layer comprising the hole-transporting host compound.

12. The device of claim 1, wherein the concentration of the wide band gap host compound is in the range of 10-60 wt %.

13. The device of claim 12, wherein the concentration of the electron-transporting host compound and the hole-transporting host compound are each in the range of 10-60 wt %.

14. The device of claim 13, wherein the concentration of the phosphorescent dopant is in the range of 0.5-10 wt %.

15. The device of claim 1, wherein the phosphorescent dopant is a sensitizer dopant and wherein the electroluminescent layer further comprises an emitter dopant, wherein the triplet energy of the emitter dopant is lower than the triplet energy of the sensitizer dopant.

16. A method of making an organic light-emitting device, comprising:
    providing a first electrode;
    forming an organic electroluminescent layer over the first electrode, the organic electroluminescent layer comprising a phosphorescent dopant and a host material comprising the following three different compounds:
    (a) an electron-transporting host compound having a triplet energy that is greater than the triplet energy of the phosphorescent dopant;
    (b) a hole-transporting host compound having a triplet energy that is greater than the triplet energy of the phosphorescent dopant; and
    (c) a wide band gap host compound having a molecular weight of less than 2,000;
    wherein the wide band gap host compound has a band gap of at least 2.0 eV and a triplet energy that is greater than the triplet energy of the phosphorescent dopant, and the hole-transporting host compound is an organometallic complex; and
    forming a second electrode over the organic electroluminescent layer.

17. The method of claim 16, wherein the organic electroluminescent layer is formed by vacuum thermal evaporation of the host compounds.

18. The method of claim 17, wherein two or more of the electroluminescent layer compounds are pre-mixed prior to vacuum thermal evaporation.

19. The method of claim 16, wherein the electron-transporting host compound is an oxadiazole, a benzimidazole, a triazole, a triazine, a benzothiazole, or a carbazole compound.

20. The method of claim 16, wherein the organometallic complex is an iridium complex or zinc complex.

* * * * *